United States Patent
Kim et al.

(10) Patent No.: US 8,411,514 B2
(45) Date of Patent: Apr. 2, 2013

(54) MULTI-CHIP PACKAGE INCLUDING OUTPUT ENABLE SIGNAL GENERATION CIRCUIT AND DATA OUTPUT CONTROL METHOD THEREOF

(75) Inventors: Ki Han Kim, Uijeongbu-si (KR); Hyun Woo Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 134 days.

(21) Appl. No.: 12/981,453

(22) Filed: Dec. 29, 2010

(65) Prior Publication Data

US 2011/0241733 A1     Oct. 6, 2011

(30) Foreign Application Priority Data

Mar. 31, 2010   (KR) .................. 10-2010-0029513

(51) Int. Cl.
*G11C 7/10*       (2006.01)
(52) U.S. Cl. ............................... 365/189.05; 365/233.11
(58) Field of Classification Search ............. 365/189.05, 365/189.08, 233.1, 233.11, 233.17
See application file for complete search history.

(56) References Cited

U.S. PATENT DOCUMENTS

| 7,453,745 B2 * | 11/2008 | Park et al. ................... 365/193 |
| 2007/0002651 A1 * | 1/2007 | Lee ................................ 365/203 |
| 2010/0007381 A1 | 1/2010 | Yokoo |

FOREIGN PATENT DOCUMENTS

KR        1020080089907 A      10/2008

* cited by examiner

*Primary Examiner* — An Luu
(74) *Attorney, Agent, or Firm* — William Park & Associates Ltd.

(57) ABSTRACT

An output enable signal generation circuit includes a latency decoder, a latch unit, a latency multiplexer, and an enable setting unit. The latency decoder is configured to decode a mode register set code and generate first and second CAS latency information. The latch unit is configured to output the latched first and second latency information as first and second latency signals. The latency multiplexer is configured to output the first or second latency signal as an output CAS latency signal in response to a chip select signal. The enable setting unit is configured to set an enable timing of an output enable signal.

16 Claims, 3 Drawing Sheets

MULTI-CHIP PACKAGE INCLUDING OUTPUT ENABLE SIGNAL GENERATION CIRCUIT AND DATA OUTPUT CONTROL METHOD THEREOF

CROSS-REFERENCES TO RELATED APPLICATIONS

The present application claims priority under 35 U.S.C. 119(a) to Korean Application No. 10-2010-0029513, filed on Mar. 31, 2010, in the Korean intellectual property Office, which is incorporated herein by reference in its entirety.

BACKGROUND

Due to rapid technological advancements in the semiconductor industries and by user demands, the electronic devices are made to be more compact and lightweight. To this end, the multi-chip package having the semiconductor chips mounted on a lead frame for a single package is widely used in devices such as a portable phone requiring miniaturization and lightweight.

FIG. 1 shows the configuration of a conventional multi-chip package, and FIG. 2 shows the configuration of a conventional output enable signal generation circuit.

The conventional multi-chip package shown in FIG. 1 has the first to third slave chips SLAVE_CHIP1, SLAVE_CHIP2, SLAVE_CHIP3 stacked on the master chip MASTER_CHIP.

In the multi-chip package having such a configuration of FIG. 1, data are inputted/outputted through the master chip MASTER_CHIP, and this means that the input/output data paths of the first to third slave chips SLAVE_CHIP1, SLAVE_ CHIP1, SLAVE_CHIP3 (for example, DP2, one path from the SLAVE_CHIP3, is shown in FIG. 1) are longer than the data path DP1 of the master chip MASTER_CHIP. Then, for a stable operation, the column address strobe (CAS) latency (CL) of the conventional multi-chip package as shown in FIG. 1 must be set with reference to the longest data path DP2 of the third slave chip SLAVE_CHIP3, and the enable timing of an output enable signal (OE) for the data output in a read operation must be adjusted with reference to the CL set according to the longest data path DP2. For example, when the CL of the master chip MASTER_CHIP is assumed to be 3 tCK, it follows then that the CL of the first slave chip SLAVE_CHIP1 could be 3.5 tCK; the CL of the second slave chip SLAVE_CHIP2 could be 4 tCK; and the CL of the third slave chip SLAVE_CHIP3 could be 4.5 tCK. That is, the CL of each chip is larger as the data path of the chip is longer. To ensure the stable data output operation in such a conventional multi-chip package, the enable timing of the output enable signal (OE) for a data output must be determined according to the largest CL of 4.5 tCK of the third slave chip SLAVE_CHIP3.

FIG. 2 illustrates the configuration of a conventional output enable signal generation circuit implemented in a conventional multi-chip package as shown in FIG. 1.

As shown in FIG. 2, the conventional output enable signal generation unit includes a CAS latency setting unit 10 and an enable setting unit 11. The CAS latency setting unit 10 is configured to receive a mode register set command MRS_CMD inputted for a mode register set and generate an enabled CAS latency signal of CL4.5, the largest among the CL examples above. The enable setting unit 11 is then configured to receive the CAS latency signal CL4.5 and set an enable timing of an output enable signal OE for data output.

To ensure the stable data output of a conventional multi-chip package as shown in FIG. 1, the output enable signal generation circuit shown in FIG. 2 enables the CAS latency signal CL4.5 according to the CL of the third slave chip SLAVE_CHIP3 having the longest data path and determines the enable timing of the output enable signal OE according to the CAS latency signal CL4.5.

Therefore, in case the master chip MASTER_CHIP and the first and second slave chips SLAVE_CHIP1, SLAVE_CHIP2 whose CLs are set to be smaller than the CL of the third slave chip SLAVE_CHIP3, the data is outputted at a timing later than the timing at which the data is actually ready to be outputted.

SUMMARY

An embodiment of the present invention relates to an output enable signal generation circuit and a data output control method of a multi-chip package, which are capable of enhancing a data output speed in the multi-chip package.

In one embodiment, an output enable signal generation circuit includes: a latency decoder configured to decode a mode register set code and generate first and second latency information; a latch unit configured to latch the first and second latency information in synchronization with first and second enable signals and output the latched first and second latency information as first and second latency signals; a latency multiplexer configured to output the first or second latency signal as an output latency signal in response to a chip select signal; and an enable setting unit configured to set an enable timing of an output enable signal in response to the output latency signal.

In another embodiment, a multi-chip package, in which a slave chip is stacked on a master chip and data is outputted through the master chip during read operations, comprises: an output enable signal generation circuit configured to generate first and second latency signals from first and second latency information, generate an output enable signal whose enable timing is set according to the first latency signal during the read operation of the master chip, and generate an output enable signal whose enable timing is set according to the second latency signal during the read operation of the slave chip.

In another embodiment, a data output control method of a multi-chip package includes: generating first and second latency signals transferred through a mode register set operation; and outputting accessed data of a first chip during a read operation of the first chip at an enable timing of an output enable signal set by the first latency signal, and outputting accessed data of a second chip during a read operation of the second chip at an enable timing of the output enable signal set by the second latency signal.

BRIEF DESCRIPTION OF THE DRAWINGS

The above and other aspects, features, and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
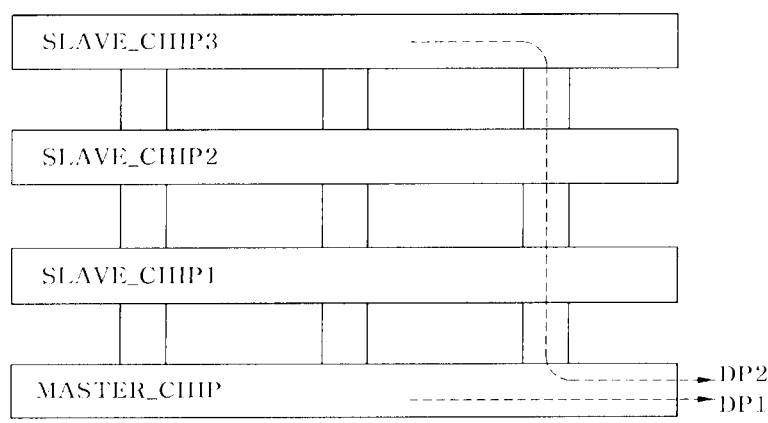
FIG. 1 illustrates a configuration of a conventional multi-chip package.
Figure 2:
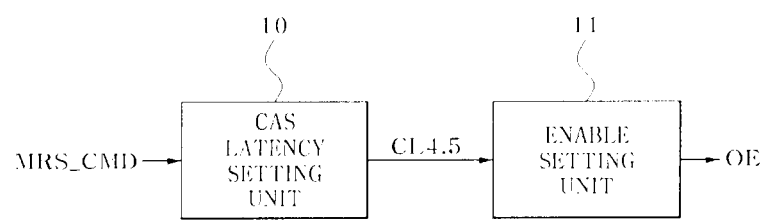
FIG. 2 is a block diagram illustrating a configuration of a conventional output enable signal generation circuit.
Figure 3:
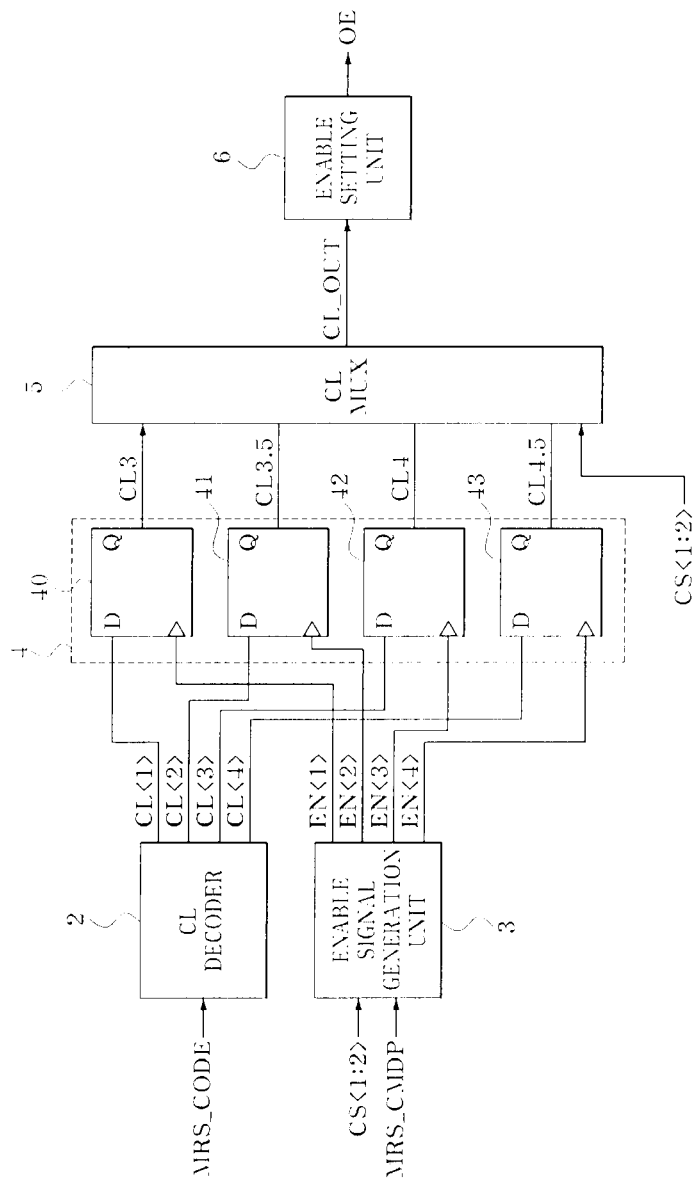
FIG. 3 is a block diagram illustrating a configuration of an output enable signal generation circuit according to an embodiment of the present invention.
Figure 4:
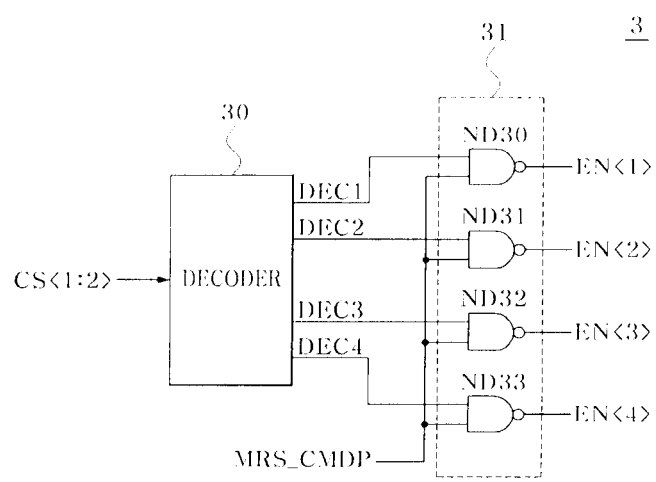
FIG. 4 illustrates a configuration of an enable signal generation unit included in the output enable signal generation circuit of FIG. 3.

FIG. 3 shows the configuration of an output enable signal generation circuit according to an embodiment of the present invention, and FIG. 4 shows the configuration of an enable signal generation unit 3 included in the output enable signal generation circuit of FIG. 3.

Referring to FIG. 3, the output enable signal generation circuit according to an embodiment of the present invention includes a CAS latency decoder 2, an enable signal generation unit 3, a latch unit 4, a CAS latency multiplexer 5, and an enable setting unit 6. The output enable signal generation circuit shown in FIG. 3 according to an embodiment of the present invention can be provided in a multi-chip package having a master chip MASTER_CHIP and first to third slave chips SLAVE_CHIP1, SLAVE_CHIP2, SLAVE_CHIP3 stacked thereon to generate an output enable signal OE controlling a data output timing. For illustrative purposes in this disclosure, the CAS latency will be assumed as: 3 tCK for the CL of the master chip MASTER_CHIP; 3.5 tCK for the CL of the first slave chip SLAVE_CHIP1; 4 tCK for the CL of the second slave chip SLAVE_CHIP2; and 4.5 tCK for the CL of the third slave chip SLAVE_CHIP3.

The CAS latency decoder 2 is implemented in a typical decoder circuit, which decodes a mode register set code MRS_CODE and generates first to fourth CAS latency information CL<1:4> where CL<1>, CL<2>, CL<3>, CL<4> are selectively enabled to a logic high level.

The mode register set code MRS_CODE may be sequentially inputted during a mode register set operation as follows: 'L, L', 'L, H', 'H, L', and 'H, H'. The first to fourth CAS latency information CL<1:4> are then sequentially enabled to a logic high level as shown in Table 1 below.

TABLE 1

| MRS_CODE | | CL<4> | CL<3> | CL<2> | CL<1> |
|---|---|---|---|---|---|
| L | L | L | L | L | H |
| L | H | L | L | H | L |
| H | L | L | H | L | L |
| H | H | H | L | L | L |

Now referring to FIG. 4, the enable signal generation unit 3 of FIG. 3 includes a decoder 30 and an output section 31. The decoder 30 is configured to decode the first and second chip select signals CS<1:2> and generate first to fourth decoding signals DEC1, DEC2, DEC3, DEC4 where each decoding signal is sequentially enabled to a logic high level. The output section 31 includes NAND gates ND30, ND31, ND32, ND33 configured to output first to fourth enable signals EN<1:4> by buffering the first to fourth decoding signals DEC1, DEC2, DEC3, DEC4 whenever a pulse of a mode register set command pulse MRS_CMDP is inputted. The first and second chip select signals CS<1:2> may be sequentially inputted during a mode register set operation as follows: 'L, L', 'L, H', 'H, L', and 'H, H'. The first to fourth decoding signals DEC1, DEC2, DEC3, DEC4 are then sequentially enabled to a logic high level as shown in Table 2 below.

TABLE 2

| CS<2> | CS<1> | DEC4 | DEC3 | DEC2 | DEC1 |
|---|---|---|---|---|---|
| L | L | L | L | L | H |
| L | H | L | L | H | L |
| H | L | L | H | L | L |
| H | H | H | L | L | L |

The latch unit 4 includes a first latch 40, a second latch 41, a third latch 42, and a fourth latch 43 implemented with D flip-flops. The first latch 40 is configured to latch the first CAS latency information CL<1> in a period in which the first enable signal EN<1> of a logic high level is inputted and output the latched first CAS latency information CL<1> as a first CAS latency signal CL3 at a timing when the first enable signal EN<1> changes to a logic low level. The second latch 41 is configured to latch the second CAS latency information CL<2> in a period in which the second enable signal EN<2> of a logic high level is inputted and output the latched second CAS latency information CL<2> as a second CAS latency signal CL3.5 at a timing when the second enable signal EN<2> changes to a logic low level. The third latch 42 is configured to latch the third CAS latency information CL<3> in a period in which the third enable signal EN<3> of a logic high level is inputted and output the latched third CAS latency information CL<3> as a third CAS latency signal CL4 at a timing when the third enable signal EN<3> changes to a logic low level. The fourth latch 43 is configured to latch the fourth CAS latency information CL<4> in a period in which the fourth enable signal EN<4> of a logic high level is inputted and output the latched fourth CAS latency information CL<4> as a fourth CAS latency signal CL4.5 at a timing when the fourth enable signal EN<4> changes to a logic low level. The first CAS latency signal CL3 is a signal which is enabled to a logic high level in order to set the CL to 3 tCK. The second CAS latency signal CL3.5 is a signal which is enabled to a logic high level in order to set the CL to 3.5 tCK. The third CAS latency signal CL4 is a signal which is enabled to a logic high level in order to set the CL to 4 tCK. The fourth CAS latency signal CL4.5 is a signal which is enabled to a logic high level in order to set the CL to 4.5 tCK.

The CAS latency multiplexer 5 is configured to output one of the first to fourth CAS latency signals CL3, CL3.5, CL4, CL4.5 as an output CAS latency signal CL_OUT in response to the first and second chip select signals CS<1:2>. More specifically, in the multi-chip package including the master chip MASTER_CHIP and the first to third slave chips SLAVE_CHIP1, SLAVE_CHIP2, SLAVE_CHIP3, the CAS latency multiplexer 5 outputs the first CAS latency signal CL3 as the output CAS latency signal CL_OUT when the master chip MASTER_CHIP is selected or outputs the second CAS latency signal CL3.5 as the output CAS latency signal CL_OUT when the first slave chip SLAVE_CHIP1 is selected. Similarly, the CAS latency multiplexer 5 outputs the third CAS latency signal CL4 as the output CAS latency signal CL_OUT when the second slave chip SLAVE_CHIP2 is selected or outputs the fourth CAS latency signal CL4.5 as the output CAS latency signal CL_OUT when the third slave chip SLAVE_CHIP3 is selected.

The enable setting unit 6 is configured to set an enable timing of the output enable signal OE for data output in the multi-chip package according to the output CAS latency signal CL_OUT.

The operation of the output enable signal generation circuit configured as above will be described.

When the mode register set operation is started, the mode register set code MRS_CODE and the first and second chip select signals CS<1:2> are sequentially inputted in combinations of 'L, L', 'L, H', 'H, L', and 'H, H', and the pulse of the mode register set command pulse MRS_CMDP is inputted in synchronization with the combinations of the mode register set code MRS_CODE and the first and second chip select signals CS<1:2>.

First, the first CAS latency information CL<1> is enabled to a logic high level by the mode register set code MRS_CODE having the 'L, L' combination. The first enable signal EN<1> is enabled to a logic low level by the first and second chip select signal CS<1:2> having the 'L, L' combination and the first pulse of the mode register set command pulse MRS_CMDP, and the first CAS latency information CL<1> is transferred as the first CAS latency signal CL3.

Next, the second CAS latency information CL<2> is enabled to a logic high level by the mode register set code MRS_CODE having the 'L, H' combination. The second enable signal EN<2> is enabled to a logic low level by the first and second chip select signal CS<1:2> having the 'L, H' combination and the second pulse of the mode register set command pulse MRS_CMDP, and the second CAS latency information CL<2> is transferred as the second CAS latency signal CL3.5.

Then, the third CAS latency information CL<3> is enabled to a logic high level by the mode register set code MRS_CODE having the 'H, L' combination. The third enable signal EN<3> is enabled to a logic low level by the first and second chip select signal CS<1:2> having the 'H, L' combination and the third pulse of the mode register set command pulse MRS_CMDP, and the third CAS latency information CL<3> is transferred as the third CAS latency signal CL4.

Then, the fourth CAS latency information CL<4> is enabled to a logic high level by the mode register set code MRS_CODE having the 'H, H' combination. The fourth enable signal EN<4> is enabled to a logic low level by the first and second chip select signal CS<1:2> having the 'H, H' combination and the fourth pulse of the mode register set command pulse MRS_CMDP, and the fourth CAS latency information CL<4> is transferred as the fourth CAS latency signal CL4.5.

As described above, the first to fourth CAS latency information CL<1:4> transferred through the mode register set code MRS_CODE in the mode register set operation is latched and outputted as the first to fourth CAS latency signals CL3, CL3.5, CL4, and CL4.5.

In the multi-chip package including the master chip MASTER_CHIP and the first to third slave chips SLAVE_CHIP1, SLAVE_CHIP2, SLAVE_CHIP3, the operation of the output enable signal generation circuit when the mode register set operation is completed will be described below in more detail.

The CAS latency multiplexer 5 outputs the first CAS latency signal CL3 as the output CAS latency signal CL_OUT when the master chip MASTER_CHIP is selected or outputs the second CAS latency signal CL3.5 as the output CAS latency signal CL_OUT when the first slave chip SLAVE_CHIP1 is selected. Similarly, the CAS latency multiplexer 5 outputs the third CAS latency signal CL4 as the output CAS latency signal CL_OUT when the second slave chip SLAVE_CHIP2 is selected or outputs the fourth CAS latency signal CL4.5 as the output CAS latency signal CL_OUT when the third slave chip SLAVE_CHIP3 is selected.

Therefore, when the master chip MASTER_CHIP is selected, the enable timing of the output enable signal OE outputted from the enable setting unit 6 is determined by the first CAS latency signal CL3. When the first slave chip SLAVE_CHIP1 is selected, the enable timing of the output enable signal OE is determined by the second CAS latency signal CL3.5. When the second slave chip SLAVE_CHIP2 is selected, the enable timing of the output enable signal OE is determined by the third CAS latency signal CL4. When the third slave chip SLAVE_CHIP3 is selected, the enable timing of the output enable signal OE is determined by the fourth CAS latency signal CL4.5.

As such, when the output enable signal generation circuit according to an embodiment of the present invention is applied to the multi-chip package, the enable timing of the output enable signal OE may be set according to the read operations of the chips having different data paths. That is, when the master chip MASTER_CHIP1 is selected, the enable timing of the output enable signal OE may be set according to the CL of 3 tCK. When the first slave chip SLAVE_CHIP1 is selected, the enable timing of the output enable signal OE may be set according to the CL of 3.5 tCK. When the second slave chip SLAVE_CHIP2 is selected, the enable timing of the output enable signal OE may be set according to the CL of 4 tCK. When the third slave chip SLAVE_CHIP3 is selected, the enable timing of the output enable signal OE may be set according to the CL of 4.5 tCK. Therefore, it is possible to enhance the data output speed during the read operations of the chips having short data paths in the multi-chip package.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. An output enable generation circuit comprising:
a latency signal generation unit outputting a first latency signal for a first latency and outputting a second latency signal for a second latency; and
an output enable signal generation unit outputting an output enable signal, wherein an enable timing of the output enable signal is set in response to the first latency signal when the first latency is selected or in response to the second latency signal when the second latency is selected,
wherein the first and second latencies are caused by different data path lengths of two chips in a multichip package, and wherein the first or second latency is selected in response to a chip select signal received by the output enable signal generation unit.

2. The output enable signal generation circuit of claim 1, wherein the latency signal generation unit comprises: a latency decoder configured to decode a mode register set code and generate a first latency information and a second latency information; a latch unit configured to latch the first and second latency information in synchronization with first and second enable signals and output the latched first and second latency information as the first and second latency signals; and wherein the output enable signal generation unit comprises: a latency multiplexer configured to output the first or second latency signal as an output latency signal in response to a chip select signal; and an enable setting unit configured to set the enable timing of an output enable signal in response to the output latency signal.

3. The output enable signal generation circuit of claim 2, wherein the latch unit comprises: a first latch configured to latch the first latency information in synchronization with the first enable signal and output the latched first latency information as the first latency signal; and a second latch configured to latch the second latency information in synchronization with the second enable signal and output the latched second latency information as the second latency signal.

4. The output enable signal generation circuit of claim 2, further comprising an enable signal generation unit configured to generate the first and second enable signals selectively enabled in response to the chip select signal and a mode register set command pulse.

5. The output enable signal generation circuit of claim 4, wherein the enable signal generation unit comprises: a decoder configured to decode the chip select signal and generate first and second decoding signals; and an output section configured to buffer the first and second decoding signals in response to the mode register set command pulse, and output the buffered first and second decoding signals as the first and second enable signals.

6. A multi-chip package in which a slave chip is stacked on a master chip and data is outputted through the master chip during read operations, the multi-chip package comprising: an output enable signal generation circuit configured to generate first and second latency signals from first and second latency information, generate an output enable signal whose enable timing is set according to the first latency signal during the read operation of the master chip, and generate an output enable signal whose enable timing is set according to the second latency signal during the read operation of the slave chip.

7. The multi-chip package of claim 6, wherein the output enable signal generation circuit comprises: a latency decoder configured to decode a mode register set code and generate the first and second latency information; a latch unit configured to latch the first and second latency information in synchronization with first and second enable signals and output the latched first and second latency information as the first and second latency signals; a latency multiplexer configured to output the first or second latency signal as an output latency signal in response to a chip select signal; and an enable setting unit configured to set the enable timing of the output enable signal in response to the output latency signal.

8. The multi-chip package of claim 7, wherein the latch unit comprises: a first latch configured to latch the first latency information in synchronization with the first enable signal and output the latched first latency information as the first latency signal; and a second latch configured to latch the second latency information in synchronization with the second enable signal and output the latched second latency information as the second latency signal.

9. The multi-chip package of claim 7, wherein the output enable signal generation circuit further comprises an enable signal generation unit configured to generate the first and second enable signals selectively enabled in response to the chip select signal and a mode register set command pulse.

10. The multi-chip package of claim 9, wherein the enable signal generation unit comprises: a decoder configured to decode the chip select signal and generate first and second decoding signals; and an output section configured to buffer the first and second decoding signals in response to the mode register set command pulse, and output the buffered first and second decoding signals as the first and second enable signals.

11. A data output control method of a multi-chip package comprising a first chip and a second chip, the data output control method comprising: generating first and second latency signals determined based on a mode register set operation; and outputting accessed data of the first chip during a read operation of the first chip at an enable timing of an output enable signal set by the first latency signal, and outputting accessed data of the second chip during a read operation of the second chip at an enable timing of the output enable signal set by the second latency signal.

12. The data output control method of claim 11, wherein the generating of the first and second latency signals comprises: generating the first and second latency information by decoding the mode register set code; latching the first and second latency information in synchronization with first and second enable signals and outputting the latched first and second latency information as the first and second latency signals.

13. The data output control method of claim 12, wherein the latching and outputting of the first and second latency information comprises: latching the first latency information in synchronization with the first enable signal and outputting the latched first latency information as the first latency signal; and latching the second latency information in synchronization with the second enable signal and outputting the latched second latency information as the second latency signal.

14. The data output control method of claim 11, wherein the outputting of the accessed data of the first and second chips comprises: outputting the first or second latency signal as an output latency signal in response to a chip select signal; and setting the enable timing of the output enable signal in response to the output latency signal.

15. The data output control method of claim 11, further comprising generating the first and second enable signals selectively enabled in response to the chip select signal and a mode register set command pulse.

16. The data output control method of claim 15, wherein the generating of the first and second enable signals comprises: generating first and second decoding signals by decoding the chip select signal; and buffering the first and second decoding signals in response to the mode register set command pulse, and outputting the buffered first and second decoding signals as the first and second enable signals.

* * * * *